United States Patent [19]

Tarlow et al.

[11] Patent Number: 5,045,327

[45] Date of Patent: Sep. 3, 1991

[54] DIGITAL RECORDING AND PLAYBACK MODULE SYSTEM

[75] Inventors: Kenneth A. Tarlow, Playa del Rey, Calif.; David Silver, Dallas, Tex.; William Avery, Incline Village, Nev.

[73] Assignee: Sound Memory Corporation, Dallas, Tex.

[21] Appl. No.: 551,033

[22] Filed: Jul. 11, 1990

[51] Int. Cl.$^5$ ............................................. G10L 5/02
[52] U.S. Cl. ......................................... 381/51; 381/36; 206/232; 365/230.03; 84/1.01
[58] Field of Search ................... 364/513.5; 381/36, 47, 381/51-53; 84/1.01, 1.03, 1.24; 206/232; 365/230.03; 369/31, 34

[56] References Cited

U.S. PATENT DOCUMENTS

| | | | |
|---|---|---|---|
| 1,541,002 | 6/1925 | Shramek | 369/273 |
| 3,063,338 | 11/1962 | Bregman | 369/273 |
| 3,312,475 | 4/1967 | Mazuranic | 369/31 |
| 3,430,761 | 4/1969 | Pelkey | 369/273 |
| 3,462,157 | 8/1969 | Barnett | 369/68 |
| 3,702,032 | 11/1972 | Doring | 369/273 |
| 4,209,850 | 6/1980 | Tazaki et al. | 365/230.03 |
| 4,389,541 | 6/1983 | Nakano et al. | 381/51 |
| 4,402,065 | 8/1983 | Taylor | 365/230.03 |
| 4,525,878 | 7/1985 | Lowe | 2/185 |
| 4,611,262 | 9/1986 | Galloway et al. | 206/232 |
| 4,653,100 | 3/1987 | Barnett et al. | 381/52 |
| 4,672,670 | 6/1987 | Wang et al. | 381/47 |
| 4,698,776 | 10/1987 | Shibata | 364/513.5 |
| 4,702,140 | 10/1987 | Goldfarb | 84/1.01 |

FOREIGN PATENT DOCUMENTS

| | | | |
|---|---|---|---|
| 2912139 | 10/1980 | Fed. Rep. of Germany | 365/2 |
| 3532259 | 3/1987 | Fed. Rep. of Germany | 381/51 |

OTHER PUBLICATIONS

Outlook-Magnetic Bubbles.
Designing a Magnetic Bubble Data Recorder.
Electronics Review-Bubble Memory Gets NASA Check for Use in Space.
Improving Recorded-Announcement Service with Magnetic Bubbles.
Characterization and Test Results for a 272 K Bubble Memory Package.

*Primary Examiner*—Dale M. Shaw
*Assistant Examiner*—David D. Knepper
*Attorney, Agent, or Firm*—Lewis H. Eslinger

[57] ABSTRACT

A Digital Recording Center having a removable playback module for permanently capturing a human voice or other sounds into a compact module for playback within a greeting card or photograph. A recording center having a microphone (or other audio input device) is used to record a brief message, in a digital fashion, for loading into a playback module. Before loading the message into the playback module, the customer may listen through a speaker to determine if his message as recorded sounds proper. If the temporarily recorded message is in good form, the customer activates a transfer command button and the message is non-volatilely stored in the removable playback module. The playback module may be placed into a compartment within a greeting card or picture, ornament, a stuffed animal or doll, or even a dog tag.

17 Claims, 3 Drawing Sheets

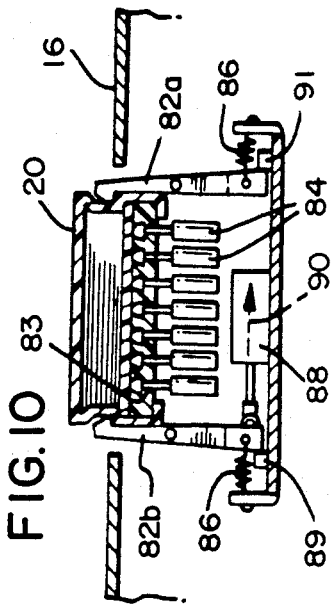
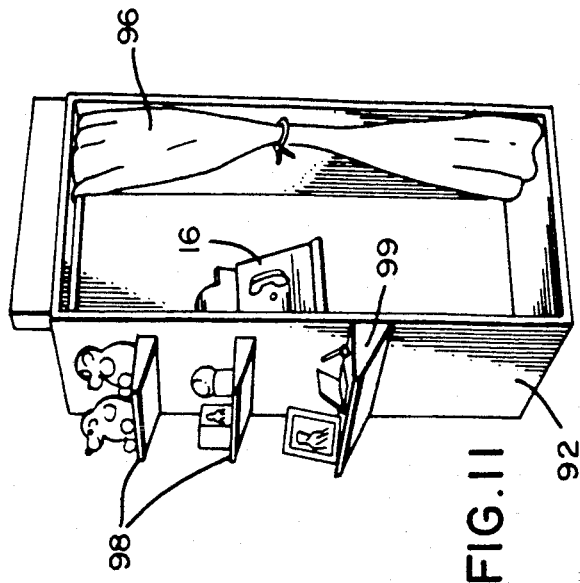
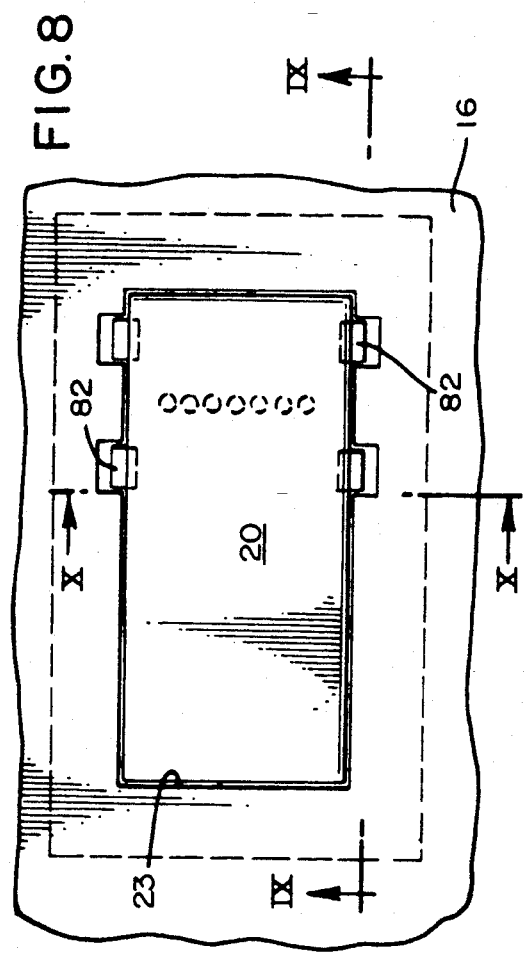
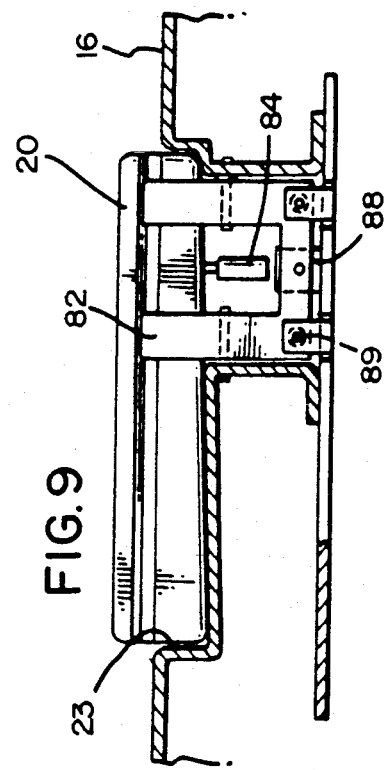

DIGITAL RECORDING AND PLAYBACK MODULE SYSTEM

This is a continuation of application Ser. No. 07/065,888, filed June 24, 1987, now abandoned.

FIELD OF THE INVENTION

This invention relates to audio-visual works, and in particular to visual works which carry a permanently stored audio message.

CROSS-REFERENCE TO CO-PENDING APPLICATION

Cross-reference is made to an application entitled "Digital Sound Delta Modulation System" to William Avery, Ser. No. 07/065,888, filed June 24, 1987, (Attorney Docket No. 66-226), assigned to the assignee of this application and filed concurrently herewith. This referenced application is hereby incorporated by reference.

BACKGROUND OF THE INVENTION

Greeting cards and photographs have given people the world over a visual memory of good times and pictures of their loved ones. Long after our closest relatives have departed this journey through life, photographs preserve the only images we have to remember them.

With all the advances in audio technology, from Edison's phonograph to the compact disc, sound recording has become common place; however, audio recordings of our friends and relatives are much rarer than photographs. The arrival of VCRs and home audio-visual cameras has changed this scarcity of audio remembrances of our relatives, but such equipment is costly and display of the audio-visual recording must be through a complex electronics system.

Heretofore, cassette recordings of one's voice or speech could be sent in the mail and played on a tape recorder; however, an investment in equipment is required on the part of the receiver of the tape in order to reproduce the sound and speech recorded message.

There is a need for an audio message system which provides reproduced sound that can be sent to a relative or friend in a medium which requires no special equipment on the part of the receiving party to hear a pre-recorded audio message.

SUMMARY OF THE INVENTION

It is an object of this invention to provide a compact, portable, and relatively inexpensive recording of human speech or other audible sound which may be played back repeatedly without a loss of sound quality. The recording would have to be of a permanent nature in order to preserve the quality and fidelity of a dear relative's voice.

It is a further object of this invention to provide an audio reproduction of speech which can be integrated into a visual display to provide, for example, a "talking" picture, greeting card, pictorial Christmas ornament, dog tag, toy doll or animal, and other novelty items suitable for an audio or audio-visual display.

Disclosed herein is a recording center and playback module system where the recording center is used to produce a permanently stored sound message, which the permanently stored message is resident in a playback module.

The recording center may be a booth display for attracting customers to use a privacy protected booth to make personal playback module recordings. Sound is detected by a telephone mouthpiece microphone at the control panel of the recording center. Alternatively, an analog or digital audio tape player (DAT) may be directly connected and input to the recording center for playing a pre-recorded off-store location cassette tape into the recording center system. The "record" control button is activated and a brief message is recorded within a time period indicated by a plurality of lights which sequentially turn off at a predetermined rate. The customer may then engage the playback button on the control panel of the recording center and listen to the playback through the earpiece of the telephone or through a speaker at the recording center booth. If the customer wishes to change his message, he re-records the message by again activating the "record" button.

Once the customer is satisfied with the message recorded in temporary storage at the booth, he then presses the "transfer" button. A "wait" indicator light is activated and this light remains "on" until a transfer is completed from temporary to permanent storage. While the "wait" light is "on", an electromechanical latch secures the playback module within its berth on the control panel of the recording center. The latch is released when the "wait" light goes off, indicating that all data has been transferred from temporary storage to the module. The module may be secured onto the control panel by a set of pivotable latches which are normally spring-biased closed and locking. At least one of the latches is releasably controlled by an electromechanical solenoid switch. At that time, a "ready" light indicates that permanent storage of the recorded sound in the playback module has been effectuated.

The playback module is a small and compact module which contains the recorded sound in a digitally-coded format. The module also contains a small dynamic speaker set back into the module, a small power supply battery, and has a button, which, when activated, reproduces the recorded sound through the dynamic speaker.

The playback module is adaptable for insertion into a compartment within a greeting card or a compartment within the frame of a photograph or portrait of the individual talking. The module may be inserted into a pictorial Christmas ornament, a dog tag, or another novelty audio-visual item. These novelty items may be resting on a shelf adjacent the privacy booth for easy customer access to these module receiving items.

Within the sound recording center is a programmable microprocessor which digitally encodes the human speech or sound which it receives from an analog to digital converter device (A/D converter). The A/D converter receives its input from an operational amplifier which is driven by the telephone mouthpiece microphone. The encoded data which represents the recorded sound is temporarily stored in a dynamic RAM chip operatively associated with the microprocessor of the sound recording center.

Once a "transfer" command is received by the microprocessor of the sound recording center, the temporary storage RAM, which contains the digitally encoded speech, transfers its data to the playback module into an EPROM chip which is operatively associated with the programmable logic array also contained within the module. The microprocessor of the sound center programs the module, during the transfer, to encode the stored data according to an adaptive delta pulse-code modulation (AD-PCM) technique. (The details of the pulse-code modulated technique is discussed in the cross-referenced application, the teachings of which are incorporated herein by reference. However, the encoding and decoding of the speech message may be accomplished by conventional digital modulation techniques.)

A method for creating a digitally recorded audio visual message into a compact and portable self-contained playback module is disclosed which includes the steps of connecting a "blank memory" electronic playback module to the sound recording center; directing a sound message into a sound detection device (telephone mouthpiece) for a predetermined time interval; recording the sound message from the detection device as digitally encoded data for storage in a programmable temporary memory storage unit; listening to the recorded message through a sound reproduction device (speaker) to ascertain the accuracy of the recorded sound message; transferring the recorded sound message to a compact permanent storage module; and, associating the compact playback module with a visual image bearing device to create an audio-visual message unit such as a "talking" greeting card, photograph, Christmas tree ornament, dog tag, a toy animal or doll, or other novelty audio-visual works.

BRIEF DESCRIPTION OF THE DRAWING

FIG. 8 is a top plan view of the playback module latching mechanism of this invention.

FIG. 9 is a cross-sectional view taken along line IX—IX of FIG. 8.

FIG. 10 is a cross-sectional view taken along line X—X of FIG. 8.

FIG. 11 is a perspective view of the privacy booth of the recording center of this invention.

DETAILED DESCRIPTION OF THE PREFERRED EMBODIMENT

Figure 1:
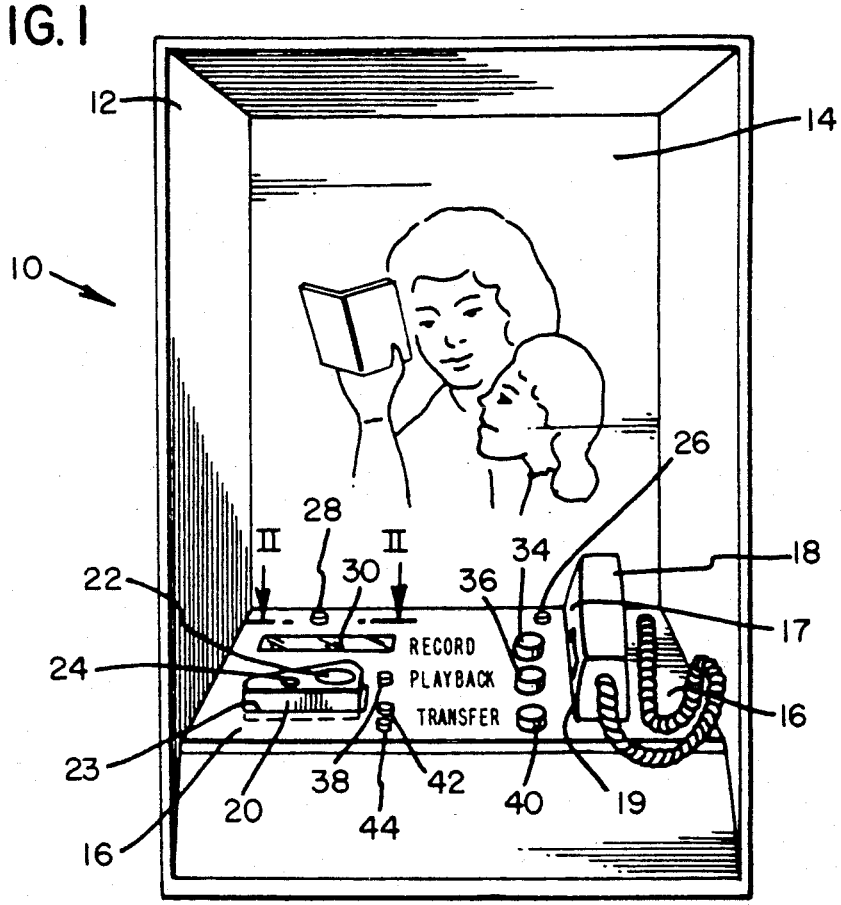
FIG. 1 is a perspective elevational front view of the recording center of this invention.
Figure 2:
FIG. 2 a plan view of the timer light of the control panel of this invention taken along line II—II of FIG. 1.

With reference to FIGS. 1 and 2, a sound recording center 10 is shown generally which may be exhibited as a booth 12 set up in the middle of a retail store preferably near the greeting card or picture section of a retail establishment. A visual display 14 may be used to attract customers to this area of the establishment. A control panel 16 within the booth 12 houses the controls necessary to record a message for permanent storage within a playback module 20.

To begin the process of recording a message, the customer picks up the telephone 18 and speaks into the mouthpiece 19. Thereof, an indicator light 26 turns "on" to alert the customer to listen (through the earphone 17 of telephone 18) to instructions before beginning the recording of the message. After the customer picks up the telephone to listen to the instructions, the light 26 goes out. Alternatively, the control panel 16 may be designed to stay lit until the playback module 20 is securely in place in its compartment 23 on the control panel 16. The compartment 23 may have male pins for insertion up into the module 20 to secure the module to the compartment during recording.

After listening to a prerecorded instruction set, the customer is instructed to begin the recording process by pressing the "record" control button 34. Activating the "record" button allows the customer to speak into the telephone mouthpiece 19 (or microphone) and record a speech or other audible message for a fixed time interval as indicated by the interval timer LED's (Light Emitting Diodes) array 32 (FIG. 2) seated under the window 30. When the recording session begins, all the LEDs in the array are "on". As the recording proceeds, the LEDs turn "off" one at a time, at a fixed rate. In the preferred embodiment, an eight second message period is indicated by 8 LEDs in the array 32 all lit up, which go "out" one at a time at one second intervals. When all the lights in the array 32 are out, the message is fully recorded in a temporary storage facility of the recording center 10. The customer may choose to record a message at home on an analog or digital audio tape cassette player (DAT) which may be directly plugged into the recording center 10, instead of using the telephone 18 provided at the control panel 16.

The customer then presses the playback control button 36, the activation of which is indicated by indicator light 38. If the customer is satisfied with the recording, he goes on to the next step, which is to transfer of the message to a permanent storage facility within the playback module 20. If the customer wishes to modify, erase, or otherwise change the recording, after playback, the customer again activates the "record" button 34 and rerecords a message within a temporary storage facility (the details of which will be discussed with regard to FIG. 6). He then listens again to the message playback through the telephone earphone 17'(speaker) by again activating the playback control button 36. This cycle of recording in temporary storage and playing the message back is repeated until the customer is satisfied with the message as recorded.

Once the customer is completely satisfied with the quality of the recording, he then proceeds to transfer the recording from temporary storage within the recording center 10 to a permanent storage location within the playback module 20. The customer activates the transfer button 40, and initially the "wait" indicator light 42 goes "on" for a predetermined period, say 10-15 seconds, to allow time to transfer data to the playback module 20. The module 20, in the preferred embodiment, contains an EPROM chip into which the permanent record of the message (stored temporarily in the recording center 10) may be "burned", as is well known in the computer art. While the transfer is occurring, a latch mechanism may be provided to secure the module 20 to the control panel 16 of the recording center 10 so that the customer cannot remove the module 20 from its berth on the control panel 16 until the transfer of data from temporary storage location (62 of FIG. 6) to the playback module 20. Once the sound message is transferred into the module 20, the indicator light 42 goes "out" and the "ready" indicator light 44 goes "on" to indicate to the customer that the playback module 20 may be removed from the sound recording center 10.

Figure 3:
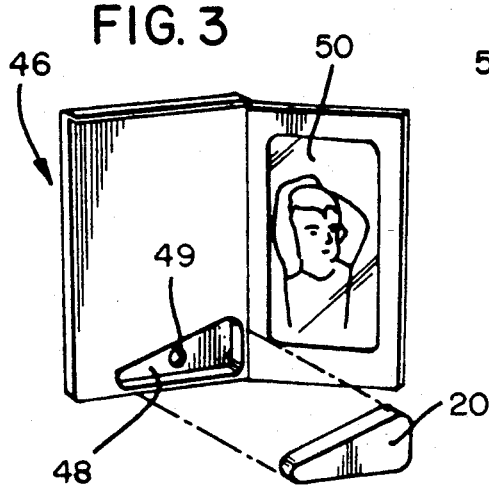
FIG. 3 is a perspective elevated view of a greeting card receiving the playback module of this invention.
Figure 4:
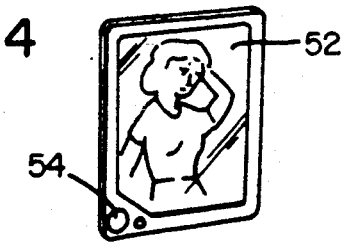
FIG. 4 is a front elevated view of a photograph and frame suitable for receiving the playback module of this invention.
Figure 5:
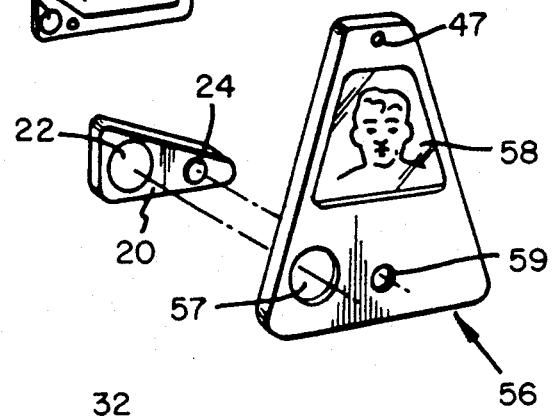
FIG. 5 is a front perspective view of an ornament receiving the playback module of FIG. 1 of this invention.

With reference to FIGS. 3 through 5, once the playback module 20 is removed from the recording center 10 (FIG. 1), the module may be placed in a module receiving compartment 48 of a greeting card 46. The compartment 48 has a button receiving aperture 49 which may be used to access the playback button 24 of the playback module 20. A photo display 50 may be secured on the opposing jacket of the card 46, so that an audio-visual greeting card 46 is created. Alternatively, the module 20 may be arranged so that its playback button 24 is facing the display (50) leaf of the greeting card. In this manner, the card 46 may be sent to a loved one closed, which when opened, delivers an audio recorded message to accompany the visual display 50. The person shown in the photo display 50 may be the same as the customer who recorded the sound; or, the greeting card may simply have an audio narration which accompanies a pre-printed visual display.

It will be noted that the playback module 20, as shown in FIGS. 1 and 5, has a mylar speaker 22 which is of a high compliance dynamic type. The speaker 22 may be set back recessed into the module 20 to enhance sound quality and range. A power supply in the form of a low power (6 volt) battery is carried in the module 20. Alternatively, the power supply may be in the card 46 or ornament 56 into which the module 20 will reside. When the customer activates the playback module button 24, sound (permanently stored in a coded format within an EPROM chip of the module 20) is reproduced by digital to analog conversion at the speaker 22 of the module 20.

In order to accommodate the button 24 and the speaker 22 of the playback module 20, an ornamental artifact, 56, (such as shown in FIG. 5), such as a Christmas tree ornament having a hole 47 at top for receiving a hook (not shown) thereon, may be provided. Also, ornament 56 and a picture frame surrounding a picture 52 (FIG. 4), each having compartments defined in their frame or body to receive the button 24 and speaker 22 of the module 20 may be provided. The picture 52 has compartments 54 in the corner of its frame to receive the module 20. Likewise, the ornament 56 (with a visual display 58) has both a speaker receiving aperture 57 and a button receiving hole 59 defined in the body of the ornament 56.

Figures 6, 7:
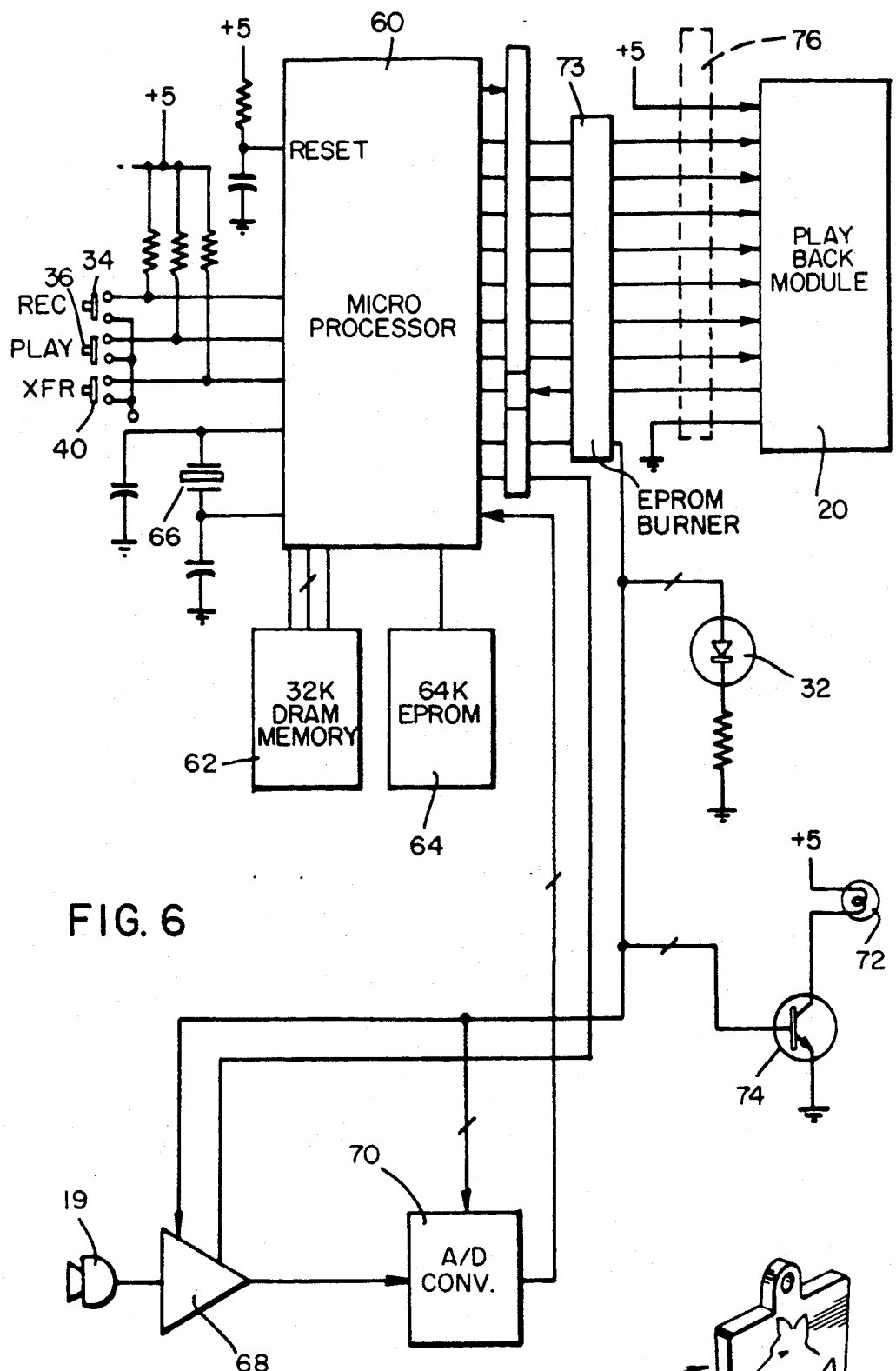
FIG. 6 is an electronic schematic block diagram of the recording center and playback module system of this invention.
FIG. 7 is a front perspective view of a dog tag designed to accommodate receipt of the playback module.

The electronic block diagram shown in FIG. 6 illustrates generally how such a recording system for producing a playback module operates. The customer speaks into the mouthpiece microphone 19 (of the telephone of FIG. 1) and the detected sound is amplified by a conventional operational amplifier 68. A conventional analog to digital converter 70 converts the analog input from amplifier 68 into a digital code in the form of digital data which a conventional microprocessor 60 is able to process. Upon activation of the record button 34, the microprocessor 60 captures the digital signals from the analog to digital converter 70 and stores an encoded form of these signals in the dynamic RAM chip temporary storage location 62. The EPROM chip 64 contains software instructions for the microprocessor 60 which the processor 60 uses to process and encode the data stored within the dynamic RAM chip 62. (The processor operates at a data rate set by a conventional crystal controlled oscillator 66). If the customer wants to listen to the temporarily stored message within dynamic RAM chip 62, the customer activates the input button 36. During recording, the processor drives the LED array (symbolized by LED 32) in a sequential manner as heretofore described. The light indicators, 26, 28 (FIG. 1) (to indicate a low power, low battery condition), 38, 42 and 44 are symbolically represented by the lamp 72, which turns "on" when driven by the processor controlled conventional transistor switch 74.

Once transfer to permanent storage is desired, the processor 60 transfers the encoded data from temporary memory 62 to a permanent storage EPROM chip (not shown) within the playback module 20 along bus lines through 76, through use of conventional EPROM burner circuitry which is contained in 73, the interface circuit.

The portable module 20 includes a permanent storage facility for a digitally encoded, audio reproducible message. By carrying its own power supply, a playback button 24, and its own dynamic speaker 22, the playback module 20 (shown in a triangular shape in the preferred embodiment, as in FIG. 5) provides a lightweight and portable sound reproduction device which may be placed in association with a visual work, such as greeting card 46 or photograph 52, to form a self-contained audio-visual work. This audio-visual work needs no special playback equipment to be seen or heard, and cannot be magnetically erased. The audio message is permanent and does not fade or degrade with time.

Referring to FIG. 7, a dog tag 80 is shown having a compartment 78 for receiving the module 20. In this manner, a "lost" dog "Fido" can identify his home through his owner's voice. Also, a toy animal, like a bear (or a doll) may have an internal cavity which receives the module and which may be activated by a "Belly-Button" reset control which protrudes from the bear's stomach.

FIGS. 8–10 illustrate the operation of the latching mechanism which functions to secure the playback module 20 into its compartment berth 23 at the control panel 16. U-shaped latch arms 82 (FIGS. 8 and 9) are positioned along side the playback module 20 at one end in order to secure the module 20 onto a plurality of male electrical connector pins 84.

FIG. 10 reveals that the pivotally motivated latch arms 82A and 82B are torsion spring 86 biased closed forming clamps against the sides of the module 20, preventing the removal of the module 20 from the compartment 23. The pivotally mounted latch arms 82A and 82B draw the underside of the module 20 in contact with the connector pins 84 as they enter the female contact apertures 83 of the module 20 underside. Only by activating a solenoid 88 is the latch arm 82B pivoted in a counter clockwise direction 90 to release the module 20. (Stoppers 91 and 89 prevent clockwise rotational movement of the latch arm 82A and 82B beyond their respective positions as mounted near the torsion springs 86).

FIG. 11 shows the recording center privacy booth 92 which contains the control panel 16 behind a privacy curtain 96 for private customer recordings. Before entering the booth 92 the customer may use the writing shelf 99 to prepare his message before entering the booth 92. The writing shelf 99 may have a timer display so that a customer may learn to practice and time his message within the eight second limit before entering the booth 92. When the recording session is over, the customer may select a novelty item into which he may place the module from the shelves 98.

While the preferred embodiment herein before described is an enabling embodiment of the applicant's invention, other equivalent sound recording systems for producing self-contained audio-visual works are envisioned by the inventor. It is therefore the intention of the applicant that the scope of the following claims be construed to extend to alternative equivalent embodiments of the invention as disclosed herein. For example, the applicant envisions that any existing form of digital encoding and decoding of the sound message may be appropriate to accomplish the functions of providing a permanent self-contained playback module for use in an audio-visual work as disclosed herein.

What is claimed is:

1. A system comprising a sound-recording apparatus and a miniature, self-contained, sound-playback module wherein the recording apparatus comprises:

temporary-storage means for recording sound;

means for playing back the sound as recorded by the temporary-storage means so that a user of the system can determine whether the recording is satisfactory, the temporary-storage means being capable of re-recording the sound if the user of the system so wishes; and means for transferring the sound as recorded or re-recorded by the temporary-storage means to the playback module as a digital signal; and wherein the playback module comprises:

a digital memory for storing the digital signal, the digital memory being capable of activation to generate a digital output signal corresponding to the stored digital signal;

a digital-to-analog converter connected to the memory for converting the digital output signal to an analog signal;

speaker means responsive to the analog signal for reproducing the sound;

a power source for powering the memory, digital-to-analog converter and speaker means; and activator means controllable by a user of the playback module to activate the memory to produce the digital output signal, thereby causing the speaker means to reproduce the sound as recorded by the recording apparatus; and further comprising connecting means releasably connecting the playback module to the recording apparatus.

2. A system according to claim 1 further comprising timing means for timing operation of the temporary-storage means during recording of sound thereby.

3. A system according to claim 2 wherein said timing means comprises a plurality of lamps operated in sequence.

4. A system according to claim 3 wherein said lamps are light-emitting diodes.

5. A system according to claim 2 wherein said timing means comprises a plurality of lamps and means for turning all of said lamps on initially and for turning said lamps off sequentially during said recording.

6. A system according to claim 1 wherein the temporary-storage means comprises a dynamic random-access memory.

7. A system according to claim 1 wherein the means for playing back the sound as recorded by the temporary-storage means comprises a playback control button, further comprising indicator means for indicating activation of the playback control button.

8. A system according to claim 1 wherein the means for transferring the sound includes a transfer button, further comprising indicator means for indicating activation of the transfer button.

9. A system according to claim 1 wherein the digital memory in the playback module comprises an erasable programmable read-only memory.

10. A system according to claim 1 wherein the activator means controllable by a user of the playback module comprises a playback button.

11. A system according to claim 1 wherein the recording apparatus is formed with a compartment for receiving the playback module and the means releasably connecting the playback module to the recording apparatus comprises at least one latch arm, biasing means for biasing the latch arm in such a manner as to hold the playback module within the compartment, and solenoid means actuable for withdrawing the latch arm so as to release the module for withdrawal from the compartment.

12. A system according to claim 1 further comprising a novelty item for attachment to the playback module.

13. A sound recording and playback method comprising the steps of:

connecting a miniature, self-contained, sound-playback module to a recording apparatus;

recording sound on temporary-storage means in the recording apparatus;

playing back the sound as recorded on the temporary-storage means to determine whether the recording is satisfactory;

re-recording the sound on the temporary-storage means as may be necessary to make the recording satisfactory;

transferring the sound as recorded or re-recorded on the temporary-storage means to the playback module as a digital signal;

storing the digital signal in a digital memory in the playback module;

disconnecting the playback module from the recording apparatus;

activating the digital memory to generate a digital output signal corresponding to the stored digital signal;

converting the digital output signal to an analog signal; and converting the analog signal to sound.

14. A method according to claim 13 further comprising the step of timing the recording of sound on the temporary-storage means.

15. A method according to claim 14 comprising the step of effecting the timing by operating a plurality of lamps in sequence.

16. A method according to claim 15, comprising the steps of initially turning the lamps on and then turning said lamps off in sequence.

17. A method according to claim 13 comprising the step of attaching the playback module to a novelty item.

* * * * *

UNITED STATES PATENT AND TRADEMARK OFFICE
CERTIFICATE OF CORRECTION

PATENT NO. : 5,045,327
DATED : September 3, 1991
INVENTOR(S) : Kenneth A. Tarlow, David Silver, William Avery It is certified that error appears in the above-identified patent and that said Letters Patent is hereby corrected as shown below:

On the title page, It should be noted:

--Related U.S. Application Data

Continuation of Serial Number 07/065,888, filed June 24, 1987, abandoned.--

Signed and Sealed this

Sixth Day of April, 1993

*Attest:*

STEPHEN G. KUNIN

*Attesting Officer*     *Acting Commissioner of Patents and Trademarks*